(12) United States Patent
Oswald et al.

(10) Patent No.: US 7,696,095 B2
(45) Date of Patent: Apr. 13, 2010

(54) AUTO-STOPPING SLURRIES FOR CHEMICAL-MECHANICAL POLISHING OF TOPOGRAPHIC DIELECTRIC SILICON DIOXIDE

(75) Inventors: Eric Oswald, Rochester, NY (US); Sean Frink, Penn Yan, NY (US); Bradley Kraft, Fairport, NY (US); Brian Santora, Penn Yan, NY (US)

(73) Assignee: Ferro Corporation, Cleveland, OH (US)

( * ) Notice: Subject to any disclaimer, the term of this patent is extended or adjusted under 35 U.S.C. 154(b) by 0 days.

(21) Appl. No.: 11/678,248

(22) Filed: Feb. 23, 2007

(65) Prior Publication Data

US 2008/0202037 A1    Aug. 28, 2008

(51) Int. Cl.
*H01L 21/302* (2006.01)

(52) U.S. Cl. .................. 438/693; 438/691; 438/692

(58) Field of Classification Search .......... 438/691, 438/692, 693, 690; 451/41, 66, 103
See application file for complete search history.

(56) References Cited

U.S. PATENT DOCUMENTS

| | | | |
|---|---|---|---|
| 4,752,628 A | 6/1988 | Payne | |
| 5,510,652 A * | 4/1996 | Burke et al. | ................. 257/752 |
| 5,860,848 A | 1/1999 | Loncki et al. | |
| 5,876,490 A | 3/1999 | Ronay | |
| 6,221,118 B1 | 4/2001 | Yoshida et al. | |
| 6,503,418 B2 | 1/2003 | Sahota et al. | |
| 6,676,718 B2 | 1/2004 | Luo et al. | |
| 6,824,579 B2 | 11/2004 | Ronay | |
| 6,863,700 B2 | 3/2005 | Yoshida et al. | |
| 6,866,793 B2 * | 3/2005 | Singh | ......................... 252/79.1 |
| 6,887,137 B2 | 5/2005 | Lee et al. | |
| 6,964,923 B1 * | 11/2005 | Ronay | ......................... 438/689 |
| 7,163,448 B2 * | 1/2007 | Hattori et al. | .................. 451/57 |
| 2004/0010978 A1 | 1/2004 | Uchino et al. | |
| 2004/0111175 A1 * | 6/2004 | Kim et al. | .................... 700/121 |
| 2004/0231246 A1 | 11/2004 | Ferranti et al. | |
| 2005/0037693 A1 * | 2/2005 | Uchikura et al. | ............. 451/41 |
| 2005/0085168 A1 | 4/2005 | Yoshida et al. | |

FOREIGN PATENT DOCUMENTS

EP      0373501     6/1990

OTHER PUBLICATIONS

Sang-Kyun Kim, "A Reverse Selectivity Ceria Slurry for the Damascene Gate Chemical Mechanical Planarization Process." Japanese Journal of Applied Physics, vol. 43, No. 11A, 2004, p. 7434-7438.

* cited by examiner

*Primary Examiner*—Lan Vinh
*Assistant Examiner*—Michael A Marcheschi
(74) *Attorney, Agent, or Firm*—Rankin, Hill & Clark LLP

(57) ABSTRACT

The present invention provides auto-stopping CMP slurry compositions that minimize post-CMP non-uniformity and also extend the time that polishing can be continued beyond the end point without the risk of over-polishing the dielectric silicon dioxide film. Auto-stopping CMP slurry compositions according to the invention include ceria abrasive particles and an effective amount of a polyalkylamine such as polyethyleneimine dispersed in water. The methods of the invention include polishing a topographic dielectric silicon dioxide film layer using the auto-stopping CMP slurry compositions to obtain a dielectric silicon dioxide surface having a desired predetermined minimum step height.

9 Claims, 3 Drawing Sheets

US 7,696,095 B2

AUTO-STOPPING SLURRIES FOR CHEMICAL-MECHANICAL POLISHING OF TOPOGRAPHIC DIELECTRIC SILICON DIOXIDE

BACKGROUND OF INVENTION

1. Field of Invention

The present invention relates to auto-stopping slurry compositions for polishing topographic dielectric silicon dioxide film layers and a method of planarizing topographic dielectric silicon dioxide film layers using the same.

2. Description of Related Art

One of the primary applications for chemical-mechanical polishing ("CMP") in integrated circuit ("IC") fabrication is the planarization of topographic dielectric silicon dioxide film layers (e.g., to form inter-level dielectric ("ILD") layers and as a first step in shallow trench isolation ("STI") processing). For purposes of illustration, the ILD CMP process is schematically depicted in FIGS. 1-3.

FIG. 1 shows a side sectional view of a portion of an IC device 10 prior to ILD layer formation. The IC device 10 includes a plurality of features 20 formed on a dielectric substrate 30, which is typically elemental silicon or a previously formed ILD layer. In the illustrated embodiment, the features 20 (which are also sometimes referred to in the art as device elements) are metal wires. It will be appreciated that other features such as resistors, capacitors, transistors, etc. will typically be present in an IC device. Although all of the features 20 shown in FIGS. 1-3 are of the same height above the dielectric substrate 30, it will be appreciated that various features will often be of different height in actual IC devices.

FIG. 2 shows the next step of the process of forming an ILD layer in which the features 20 and dielectric substrate 30 have been covered with a dielectric silicon dioxide film 40, which is typically formed via a chemical vapor deposition ("CVD-$SiO_2$") process. It will be appreciated that the dielectric silicon dioxide layer 40 can be formed by other processes The dielectric silicon dioxide film 40 covers both the features 20 and the dielectric substrate 30, thereby generally duplicating their surface topography. Thus, the top surface of the dielectric silicon dioxide film 40 is "topographic", meaning that the top surface of the dielectric silicon dioxide film includes both elevated up areas 50 and recessed down areas 60.

FIG. 3 shows the IC device 10 after ILD CMP. Ideally, the up areas 50 have been removed at a substantially greater removal rate than the down areas 60 during ILD CMP, thereby producing a substantially planar surface 70 on which additional features can be formed. Preferably, the post-ILD CMP dielectric silicon dioxide film layer 40 exhibits a substantially uniform and desired thickness.

The conventional ILD CMP process does not utilize a stop layer to prevent over-polishing of the dielectric silicon dioxide film. The conventional ILD CMP process utilizes endpoint detection techniques or predetermined fixed-time polishing techniques to determine when to stop polishing. Both of these polishing stop techniques can produce non-uniformities across the polished silicon dioxide surface due to within-die topography variations and/or within-wafer polishing rate variations. In addition, over-polishing, meaning polishing beyond the end point, tends to rapidly remove the dielectric silicon dioxide film layer thereby disadvantageously thinning the resultant ILD layer.

BRIEF SUMMARY OF THE INVENTION

In view of the foregoing, the present invention provides auto-stopping slurry compositions that minimize post-CMP non-uniformity and also extend the time that polishing can be continued beyond the end point without the risk of over-polishing the dielectric silicon dioxide film. Auto-stopping CMP slurry compositions exhibit a moderate to elevated up area topography removal rate (e.g., >5,000 Å/min), while simultaneously exhibiting a low down area removal rate. Furthermore, CMP slurry compositions according to the invention exhibit a relatively low removal rate (e.g., <1,000 Å/min) once substantial planarity has been achieved (i.e., once the up areas have been removed such that they are at or very near the level of the down areas). Auto-stopping CMP slurry compositions according to the invention can be used to effectively remove dielectric silicon oxide topography to leave a substantially planar surface. Furthermore, auto-stopping CMP slurry compositions according to the invention show very low pattern density dependency across a wide range of feature sizes and densities.

Auto-stopping CMP slurry compositions according to the present invention preferably comprise ceria abrasive particles and an effective amount of a polyalkylamine such as polyethyleneimine dispersed in an aqueous medium. The methods of the invention comprise polishing a topographic dielectric silicon dioxide film layer using the auto-stopping CMP slurry compositions according to the invention to obtain a substantially planar surface dielectric silicon dioxide surface.

The foregoing and other features of the invention are hereinafter more fully described and particularly pointed out in the claims, the following description setting forth in detail certain illustrative embodiments of the invention, these being indicative, however, of but a few of the various ways in which the principles of the present invention may be employed.

DETAILED DESCRIPTION OF THE INVENTION

Figure 1:
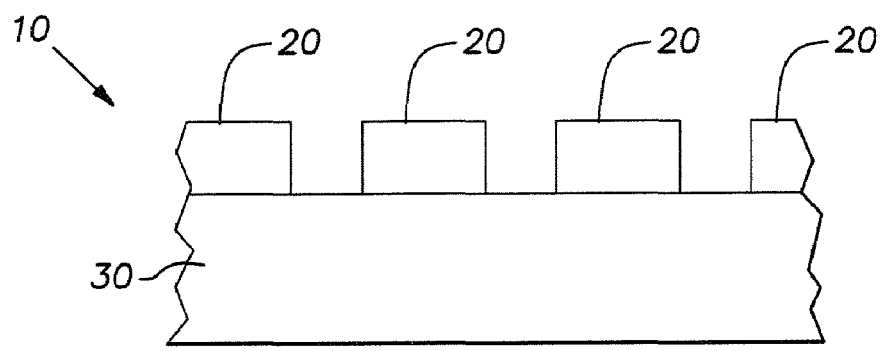
FIG. 1 is a schematic cross-sectional side view of a portion of an integrated circuit prior to the deposition of dielectric silicon dioxide during fabrication of an ILD layer.

Auto-stopping CMP slurry compositions according to the present invention preferably comprise ceria abrasive particles and an effective amount of one or more polyalkylamines, including substituted polyalkylamines, dispersed in an aqueous medium. Other compounds conventionally present in CMP slurries can also be present in the auto-stopping CMP slurry compositions according to the invention provided that such other compounds do not degrade the auto-stopping characteristics provided by the polyalkylamine(s). Examples of other compounds that may be present in the auto-stopping CMP slurry compositions according to the present invention include lubricants (e.g., ethylene oxide/propylene oxide nonionic block copolymers), surfactants, pH modifiers, pH buffers, anti-foaming agents, dispersing agents, biocides and anti-settling compounds. It should be noted that glutaraldehyde, which is used as a biocide in many conventional CMP slurry compositions, should be avoided in auto-stopping CMP slurry compositions according to the invention because it tends to break down the polyalkylamine over time, thereby reducing its auto-stopping efficiency.

Polyethyleneimine ("PEI") is the presently most preferred polyalkylamine for use in the invention. Other polyalkylamines that could be used in the invention include, for example, polyvinylamine and polydiallyl-dimethylammonium chloride. It may be possible to obtain the desired auto-stopping effects using compounds such as polyaniline, polyvinylpyridine and polyetheramines.

The preferred polyalkylamine for use in the invention, PEI, is a water soluble polymer. It can be made by several processes, but is typically made by polymerizing ethyleneimine. PEI is a partly branched polymer containing primary, secondary, and tertiary amine. The weight average molecular weight of the polyalkylamine used in the auto-stopping CMP slurry compositions according to the invention is not critical to obtaining the desired auto-stopping effect, and a wide range of molecular weights can be used (e.g., weight average molecular weights from about 800 to about 750,000 produce the desired auto-stopping effect). In view of availability and ease of use, PEI compounds having a weight average molecular weight of from about 10,000 to about 25,000 may preferably be employed.

The polyalkylamine must be present in the appropriate amount to obtain the desired auto-stopping characteristics. The term "auto-stopping" means that once the up areas on the topographic dielectric silicon dioxide layer have been removed by CMP such that they are substantially in the same plane as the down areas, the polishing rate across the substantially planar dielectric silicon dioxide top surface rapidly diminishes to a very low removal rate. Thus, polishing beyond the end point (i.e., over-polishing) does not rapidly thin the dielectric silicon dioxide layer. End point detection and maintenance is thus not per se critical to obtain a substantially planar dielectric silicon dioxide layer of the desired thickness.

The effective amount of polyalkylamine tends to be within a narrow range in terms of absolute weight percent of the auto-stopping CMP slurry. For PEI, the effective amount is from about 0.006% to about 0.04% by weight of the entire auto-stopping CMP slurry (i.e., including the ceria particles, the aqueous medium and any optional other compounds that may be present in the slurry).

The optimal amount of polyalkylamine to be used in an auto-stopping CMP slurry according to the invention can be determined through trial and error. It is known that ceria abrasive particles having a larger mean volume secondary particle diameter tend to remove dielectric silicon dioxide more rapidly than ceria abrasive particles having a smaller mean volume secondary particle diameter, and thus require the presence of a greater amount of the polyalkylamine to obtain the desired auto-stopping characteristics. If too much polyalkylamine is present in the composition however, the auto-stopping characteristic will occur too soon (i.e., before the substantial planarity is achieved). If too little polyalkylamine is present in the composition, no auto-stopping will be observed (i.e., the dielectric silicon dioxide layer will continue to be removed after substantial planarity has been achieved).

The ceria abrasive particles used in the auto-stopping CMP slurry compositions according to the present invention perform the function of mechanical grinding. The ceria abrasive particles preferably have a mean volume secondary particle diameter of from about 100 nm to about 175 nm. The ceria abrasive particles are preferably used at a concentration of from about 0.5% to about 10.0% by weight of the slurry, and more preferably from about 1.0% to about 7.5% by weight of the slurry. It will be appreciated that the slurry can be concentrated for shipment and storage, and diluted with water prior to use. Silica abrasive particles, which are often used in conventional dielectric silicon dioxide CMP slurries, cannot be used because the polyalkylamine will adsorb onto the surface of such particles. It may be possible to use abrasive particles other than ceria (e.g., iron oxide), but ceria is preferred.

The pH of auto-stopping CMP slurry compositions according to the invention is preferably adjusted to be within the range of from about 3.5 to about 6, and more preferably within the range of from about 4.0 to about 5.5. The pH of the slurry can be adjusted to the preferred pH range by the addition of an acid. $HNO_3$ is the presently preferred acid for lowering the pH of the aqueous slurry. It should be noted that when the pH of the slurry is adjusted too low, the auto-stopping behavior of the slurry tends to diminish, most likely because the acid interferes with the ability of the polyalkylamine to associate with the surface of the dielectric silicon dioxide. It may be possible to operate in the basic pH range, but it would be necessary to reverse the charge on the ceria abrasive particles in order to do so.

In the preferred embodiment of the invention, the auto-stopping CMP slurry composition comprises from about 2.0% to about 8.0% by weight, or more preferably from about 3.0% to about 6.0% by weight, cerium oxide having a secondary mean volume size of from about 120 nm to about 160 nm, or more preferably about 140 nm; from about 0.007% to about 0.03% by weight, or more preferably about 0.008% to about 0.02% by weight, of PEI; from about 0.025% to about 3.0% by weight, or more preferably from about 0.15% to about 0.3% by weight, of an ethylene oxide/propylene oxide nonionic block copolymer lubricant having a weight average molecular weight of about 500 to 30,000, or more preferably from about 1,000 to about 5,000, or about 1,500; and the balance deionized water, with all weight percentages expressed by absolute weight of the slurry. The pH of the auto-stopping CMP slurry is preferably adjusted within the range of from about 4.0 to about 5.5, or more preferably from about 4.5 to about 5.0, using $HNO_3$.

As noted above, the auto-stopping CMP slurry compositions according to the present invention exhibit moderate to high up area removal rates while simultaneously exhibiting very low down area removal rates. This produces rapid and effective planarization of dielectric silicon dioxide topography across the entire dielectric silicon dioxide layer. Once the up areas have been removed substantially to the level of the down areas, the overall dielectric silicon dioxide removal rate (also sometimes referred to herein as the "planar surface removal rate") rapidly slows down, which is defined herein as auto-stopping behavior.

Figure 2:
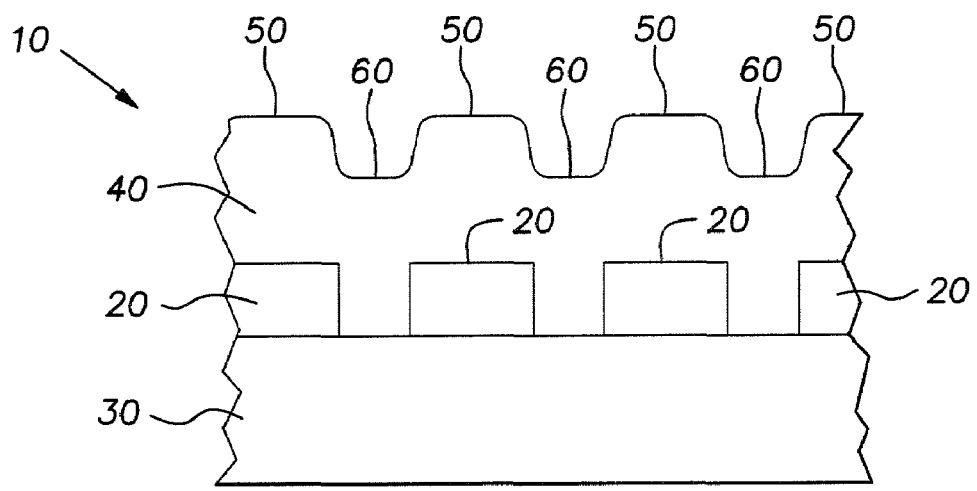
FIG. 2 is a schematic cross-sectional side view of the portion of the integrated circuit shown in FIG. 1 after a layer of dielectric silicon dioxide has been deposited thereon.
Figure 4:
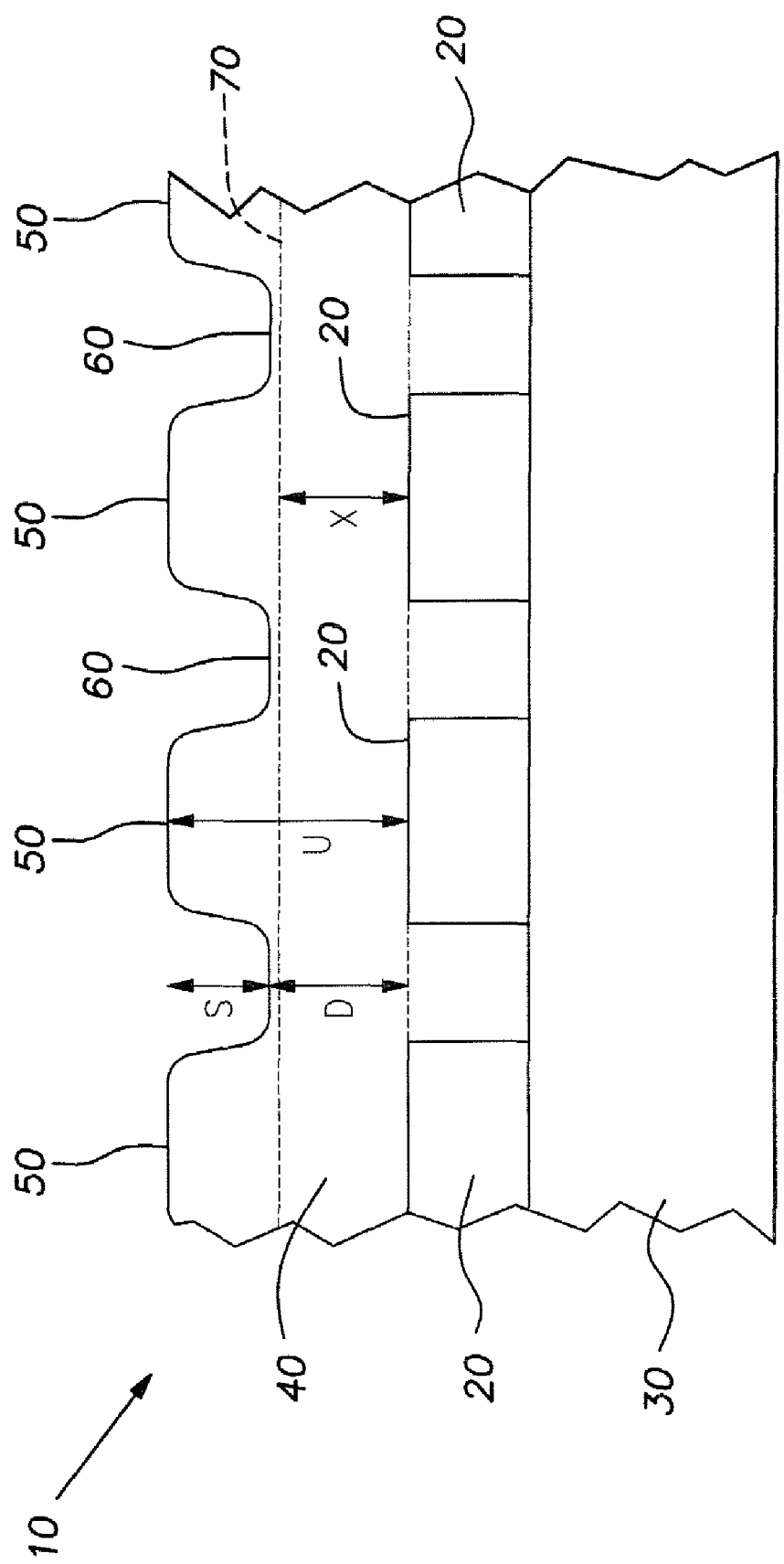
FIG. 4 is another schematic cross-sectional side view of a portion of an integrated circuit having a layer of dielectric silicon dioxide deposited thereon.

FIG. 4 is a schematic cross-sectional side view of a portion of an integrated circuit having a layer of dielectric silicon dioxide deposited thereon (FIG. 4 shows the same structures as FIG. 2, and includes the same reference numbers as FIG. 2). FIG. 4 shows the IC fabrication process in which a plurality of features 20 and the dielectric substrate 30 supporting the features 20 have been covered with a dielectric silicon dioxide layer 40. The dielectric silicon dioxide layer 40 can be formed by any process, including CVD processes, spin-on processes and thermal oxide processes. The dielectric silicon dioxide film 40 covers both the features 20 and the dielectric substrate 30, thereby generally duplicating their surface topography.

Throughout the instant specification and in the appended claims, the term "up oxide" (identified using reference symbol "U" in FIG. 4) refers to the thickness of the dielectric silicon dioxide layer 40 as measured from the level of the top surface 80 of the features 20 to the highest up areas 50, and the term "down oxide" (identified using reference symbol "D" in FIG. 4) refers to the thickness of the dielectric silicon dioxide film 40 as measured from the level of the top surface 80 of the features 20 to the lowest down areas 60. The term "step height" (identified using reference symbol "S" in FIG. 4) refers to the height difference between the up area 50 topography and down area 60 topography, and can be measured as the difference between the thickness of the up oxide and down oxide (both pre-CMP and post-CMP).

Figure 3:
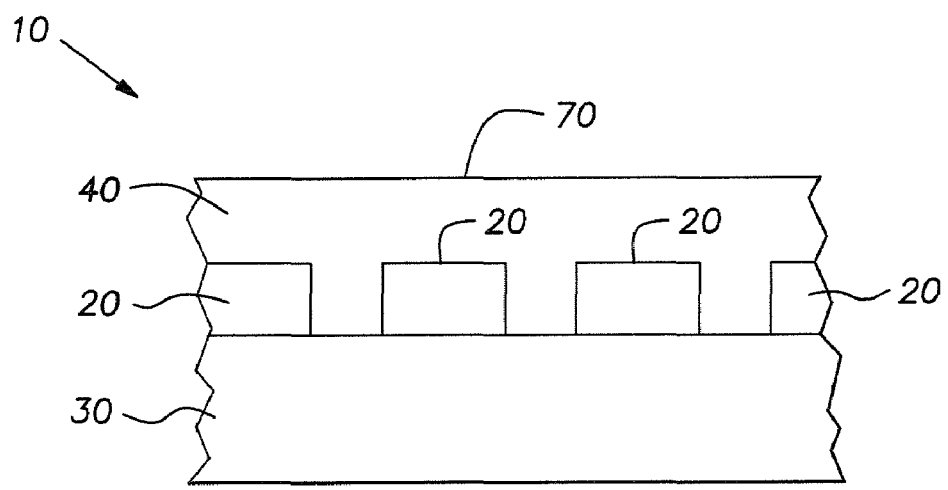
FIG. 3 is a schematic cross-sectional side view of the portion of the integrated circuit shown in FIG. 2 after the topographic surface of the deposited layer of dielectric silicon dioxide has been substantially planarized.

In FIG. 4, reference symbol "X" refers to the post-CMP thickness of the dielectric silicon dioxide. This is the thickness of the post-CMP dielectric silicon dioxide film as measured from the level of the top surface 80 of the features 20 to the post-CMP substantially planar surface on which additional device elements can be formed (see, e.g., the top surface 70 in FIG. 3).

The term "end point" refers to the moment in time during polishing when the up areas have been removed to achieve a desired post-CMP minimum step height with respect to the down areas. The end-user of the auto-stopping CMP slurry will determine the post-CMP minimum step height, which depending upon the step height of the initial dielectric silicon dioxide topography and application, will typically vary from less than about 500 Å to less than about 100 Å.

The overall polishing efficiency percentage of an auto-stopping CMP slurry composition is expressed according to the equation:

$$\frac{\left(\begin{array}{c}\text{Amount of Up Oxide Removed}-\\ \text{Amount of Down Oxide Removed}\end{array}\right)}{\text{Amount of Up Oxide Removed}} \times 100\%$$

Auto-stopping CMP slurry compositions according to the invention maintain overall polishing efficiency percentages of greater than 90% after polishing has continued for twenty-five seconds beyond the end point.

Another method of expressing the efficiency of an auto-stopping CMP slurry composition is to measure its topography selectivity, which is defined as the ratio of the topography polishing rate to the planar surface polishing rate. The term "topography polishing rate" refers to the rate at which the up areas are removed as a function of time before the end point is reached (i.e., the rate at which the thickness of the up oxide decreases as a function of time before the end point has been reached). The term "planar surface polishing rate" refers to the rate at which the up areas are removed as a function of time after the end point is reached (i.e., the rate at which the thickness of the up oxide decreases as a function of time after the end point has been reached). The "planar surface polishing rate" can also be considered the removal rate during over-polishing because, by definition, the end point is the point in time when the up oxide level has substantially reached the down oxide level (i.e., reached the desired minimum step height) and the up oxide removal rate will be identical to the down oxide removal rate at this time. Auto-stopping CMP slurry compositions according to the invention maintain a topography selectivity of at least about 5 or higher, and more preferably of at least about 9 or higher for a polishing period of over-polishing that extends twenty-five seconds beyond the end point.

Thus, the invention further provides a method of planarizing a topographic dielectric silicon dioxide film layer during integrated circuit fabrication. The method can be a first step process, which is followed by another CMP process (e.g., rapid removal of bulk dielectric silicon dioxide topography in the STI processing prior to using, in a second step, a CMP slurry that is selective for silicon dioxide as compared to silicon nitride). Or, the method can be a single step process (e.g., planarization of topographic dielectric silicon dioxide to form an ILD layer). In accordance with the method of the invention, a dielectric silicon dioxide film layer having a surface topography including up areas and down areas (also sometimes referred to herein as "topographic dielectric silicon dioxide") is contacted with a polishing pad and an auto-stopping CMP slurry composition as previously described herein. The polishing pad and the topographic dielectric silicon dioxide film layer move relative to each other while the auto-stopping CMP slurry composition is disposed therebetween. Through this action, the topographic surface of the dielectric silicon dioxide film layer is abraded until the up areas are removed to achieve a predetermined minimum step height, which is the end point. In accordance with one preferred method of the invention, the polishing pad and the topographic dielectric silicon dioxide film layer are permitted to continue to move relative to each other while the auto-stopping CMP slurry composition is disposed therebetween for a fixed period of time which is known to be beyond the end point.

The method of the invention is particularly suited for use in conjunction with convention CMP apparatus, which generally comprises: a platen, which, when in use, is in motion and has a velocity that results from orbital, linear, or circular motion; a polishing pad in contact with the platen and moving with the platen when in motion; and a carrier that holds the partially fabricated IC device having an exposed topographic dielectric silicon dioxide film layer to be polished via contact and movement relative to the polishing pad with the auto-stopping CMP slurry composition disposed therebetween.

The auto-stopping CMP slurry compositions and methods of the present invention provide for effective planarization of topographic dielectric silicon dioxide film layers without the need for costly and complicated endpoint detection systems. The auto-stopping CMP slurry compositions and methods provide better planarization as compared to conventional silica-based CMP slurry compositions, and provide less down oxide loss during polishing. Because the auto-stopping CMP slurry compositions of the invention exhibit auto-stopping behavior, the process window is larger without risking damage to the down oxide or thinning the final dielectric silicon dioxide layer. Auto-stopping CMP slurry compositions and methods according to the invention provide improved uniformity across a wide range of feature sizes and densities as compared to conventional silica-based CMP slurry compositions. Furthermore, auto-stopping CMP slurry compositions and methods according to the invention reduce the total process time relative to conventional CMP slurry compositions and methods.

The following examples are intended only to illustrate the invention and should not be construed as imposing limitations upon the claims.

EXAMPLE 1

Auto-stopping CMP Slurry 1 was formed by dispersing 2.0% ceria particles, 0.008% PEI and 0.1% of an ethylene oxide/propylene oxide nonionic block copolymer in water (all percentages stated by absolute weight of the resulting slurry). The ceria particles had an average primary particle diameter of 70 nm and an average secondary particle diameter of 180 nm. The PEI had a weight average molecular weight of about 10,000. The ethylene oxide/propylene oxide nonionic block copolymer had a weight average molecular weight of about 1,500. Nitric acid was added to adjust the pH of the slurry to 3.9.

Figure 5:
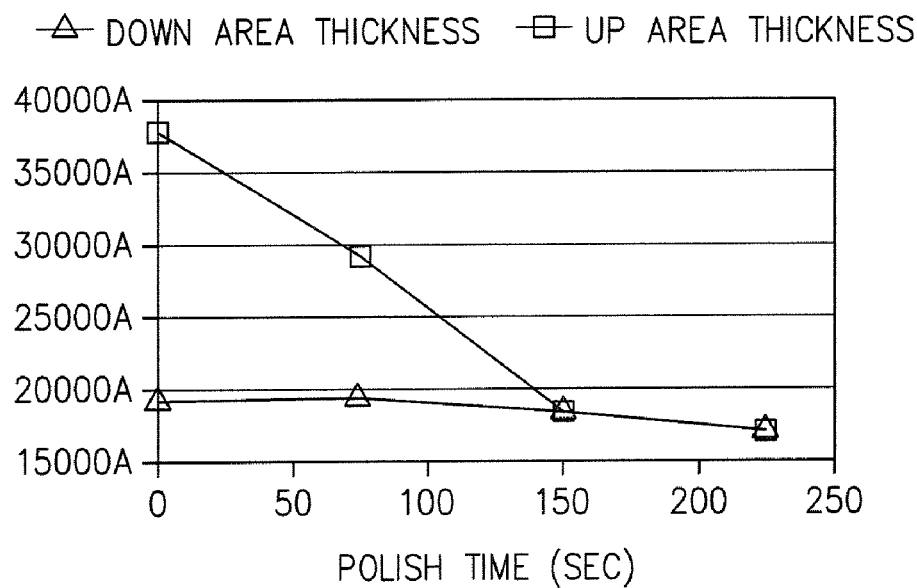
FIG. 5 is a graph showing up oxide removal rate and down oxide removal rate as a function of polish time for auto-stopping CMP Slurry 1 in Example 1.

Auto-stopping Slurry 1 was used to planarize pattern wafers containing features with various pitches and densities designed by MIT and Sematech. Before the CMP process, the average up oxide thickness of the pattern features was 37,500 Å and the average down oxide thickness of the pattern features was 20,000 Å. The thicknesses of up oxide and down oxide of nine 100-micron pitch/70% density features across the wafer center were measured by Opti-Probe for each pattern wafer polished for different times (75, 150 and 225 seconds). The data reported in FIG. 5 is the average thickness of these nine features. Pitch is defined as the sum of widths of one up oxide and one adjacent down oxide, and 70% density means 70% of the pitch is the width of up oxide. Therefore, for the features of interest in this example consist of 70-micron-wide up oxide and 30-micron-wide adjacent down oxide. The lengths of both up oxide and down oxide are 4,000 microns. The silicon oxide on the pattern wafers was TEOS oxide deposited by a CVD technique. The wafers were 200 mm in diameter.

The polisher was an Applied Materials Mirra system. The polishing pressures were 5 psi membrane pressure/6.1 psi retaining ring pressure/5 psi inner tube pressure. The platen speed was 131 rpm and the head speed was 135 rpm. The slurry flow rate was 150 ml/min. The polishing pad was a Rohm & Haas K-grooved IC1000 with a Suba 4 backing.

FIG. 5 shows a plot of the thicknesses of up oxide and down oxide vs. polish time. During the initial 150 seconds of polish time, the average polish rate of up oxide is 7,600 Å/min (19,000 Å is removed during 150 seconds of polishing). As the thickness of the up oxide equals the thickness of down oxide, the oxide surface becomes planar (i.e., at 150 seconds of polish time), and the average polish rate drops significantly to 800 Å/min (1,000 Å of both up oxide and down oxide is removed from 150 seconds to 225 seconds), resulting in a high (topography/planar surface) selectivity of 9.5.

EXAMPLE 2

Auto-stopping CMP Slurry 2 was formed by dispersing 6.0% ceria particles, 0.02% PEI and 0.3% of an ethylene oxide/propylene oxide nonionic block copolymer in water (all percentages stated by weight of the resulting slurry). The ceria particles had an average primary particle diameter of 70 nm and an average secondary particle diameter of 140 nm. The PEI had a weight average molecular weight of about 25,000. The ethylene oxide/propylene oxide nonionic block copolymer had a weight average molecular weight of about 1,500. Nitric acid was added to adjust the pH of the slurry to 4.7.

Auto-stopping Slurry 2 was used to planarize pattern wafers containing repeating features consisting of 3,200-micron wide/3,200-micron long up oxide with adjacent 320-micron wide/3,200-micron long down oxide throughout the entire wafer. Before CMP process, the average up oxide thickness of the pattern features was about 41,700 Å and the average down oxide thickness of the pattern features was about 24,000 Å. In this example, the thicknesses of up oxide and down oxide of 32 such features were measured by Opti-Probe for each pattern wafer polished for different times (150, 200 and 250 seconds). The data reported in FIG. 6 and Table 1 is the average thickness of these 32 features.

The silicon oxide on the pattern wafers was TEOS oxide deposited by CVD technique. The wafers were 200 mm in diameter.

The polisher was an Applied Materials Mirra system. The polishing pressure was 5 psi membrane pressure/6.1 psi retaining ring pressure/5 psi inner tube pressure. The platen speed was 131 rpm and the head speed was 135 rpm. The slurry flow rate was 150 ml/min. The polishing pad was a Rohm & Haas K-grooved IC1000 solo pad (no backing).

Figure 6:
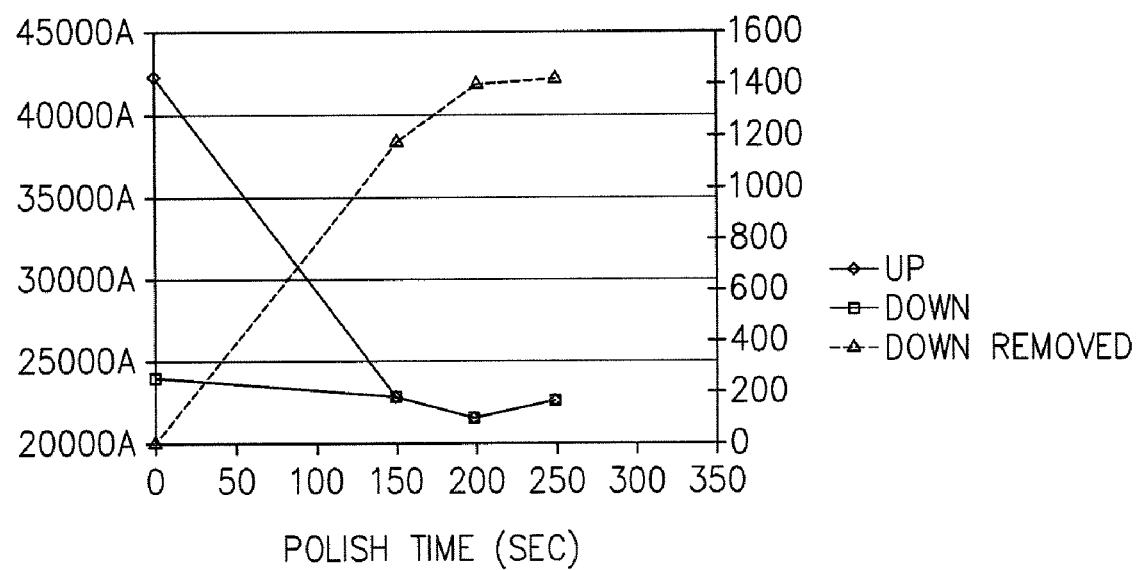
FIG. 6 is a graph showing up oxide thickness and down oxide thickness as a function of polish time for auto-stopping CMP Slurry 2 in Example 2.

FIG. 6 is a plot of up oxide and down thicknesses as well as the calculated total down oxide removal vs. polish time. During the initial 150 seconds of polish time, the average polish rate of up oxide was 7,500 Å/min (18,748 Å was removed during 150 seconds of polishing). As the thickness of up oxide equals the thickness of down oxide, the oxide surface becomes planar (i.e., at 150 seconds of polish time), and the average polish rate drops significantly to 270 Å/min (226 Å of both up oxide and down oxide was removed from 150 seconds to 200 seconds) and subsequently drops to 34 Å/min (28 Å of both up and down oxide is removed from 200 seconds to 250 seconds), resulting in a very high (topography/planar surface) selectivity of 28 and 221, respectively. This also demonstrates the auto-stopping performance of this slurry composition.

Table 1 below shows the raw data depicted in FIG. 6.

TABLE 1

| Wafer Number | Polish Time (seconds) | Pre-CMP Up Oxide Average Thickness (Å) | Pre-CMP Down Oxide Average Thickness (Å) | Post-CMP Up Oxide Average Thickness (Å) | Post-CMP Down Oxide Average Thickness (Å) | Total Down Oxide Removal (Å) |
|---|---|---|---|---|---|---|
| 1 | 150 | 41,623 | 24,074 | 22,875 | 22,898 | 1,176 |
| 2 | 200 | 41,639 | 23,015 | 21,572 | 21,613 | 1,402 |
| 3 | 250 | 41,706 | 24,095 | 22,528 | 22,665 | 1,430 |

EXAMPLE 3

COMPARATIVE CMP Slurry 3 was formed by dispersing 0.75% ceria particles and 0.075% ethylene oxide/propylene oxide nonionic block copolymer in water (all percentages stated by weight of the resulting slurry). The ceria particles had an average primary particle diameter of 70 nm and an average secondary particle diameter of 140 nm. The ethylene oxide/propylene oxide nonionic block copolymer had a weight average molecular weight of about 1,500. Nitric acid was added to adjust the pH of the slurry to 4.0. These slurry conditions were selected to produce a topography removal rate similar to that achieved using Auto-stopping CMP Slurry 2 from Example 2.

Auto-stopping CMP Slurry 2 and COMPARATIVE CMP Slurry 3 were used to polish 200 mm MIT/Sematech pattern wafers as described in Example 1, except that the wafers used for COMPARATIVE CMP Slurry 3 had thinner TEOS oxide thicknesses (the average up oxide thickness was 22,000 Å and the average down oxide thickness was 13,000 Å). The 100-micron pitch/70% density features were measured for up and down oxide thicknesses in order to compare the performance of the slurries. The measurement procedure was the same as described in Example 1, and the data is reported in Table 2.

The polisher was an Applied Materials Mirra system. For Auto-stopping CMP Slurry 2, the polishing pressure was 5 psi membrane pressure/6.1 psi retaining ring pressure/5 psi inner tube pressure. For COMPARATIVE CMP Slurry 3, the polishing pressure was 3 psi membrane pressure/3.5 psi retaining ring pressure/3 psi inner tube pressure. In all cases, the platen speed was 131 rpm and the head speed was 135 rpm, the slurry flow rate was 150 ml/min, and the polishing pad was a Rohm & Haas K-grooved IC1000 with Suba 4 backing.

For COMPARATIVE CMP Slurry 3, the up oxide thickness approached the same thickness of down oxide at 160 seconds of polish time, indicating a substantially planar surface was reached. The topography polish rate was the average up oxide polish rate during that 160 second period. The up oxide polish rate (same as the down oxide polish rate since the surface was planar at that point) during the following 25 seconds (i.e., from 160 seconds to 185 seconds) was the planar surface polish rate. The ratio of (topography polish rate/planar surface polish rate) is defined as the selectivity.

For Auto-stopping CMP Slurry 2, the planar surface was reached at 200 seconds of polish time. The topography and planar surface polish rates as well as the selectivity were calculated in a similar way. As clearly shown in Table 2, the selectivity for COMPARATIVE Slurry 3 was only 0.29, but the selectivity for Auto-stopping CMP Slurry 2 was much higher at 10.3. In addition, Auto-stopping CMP Slurry 2 eventually stopped polishing after the planar surface was reached at 200 seconds polish time, demonstrating an auto-stopping behavior. COMPARATIVE CMP Slurry 3 did not show this type of behavior.

Planarization efficiency is defined as: ((total up oxide removal−total down oxide removal)/(total up oxide removal))×100%. The planarization efficiencies of Auto-stopping CMP Slurry 2 and COMPARATIVE CMP Slurry 3 at different polish times are reported in Table 2. For COMPARATIVE CMP Slurry 3, the planarization efficiency dropped quickly as polishing continued beyond the end point (e.g., it dropped from 98% to 53%). On the other hand, Auto-stopping CMP Slurry 2 maintained planarization efficiency above 94% throughout the entire range of polish time, including polishing beyond the end point.

TABLE 2

|  | COMP. CMP SLURRY 3 | COMP. CMP SLURRY 3 | COMP. CMP SLURRY 3 | COMP. CMP SLURRY 3 | AUTO-STOPPING CMP SLURRY 2 | AUTO-STOPPING CMP SLURRY 2 | AUTO-STOPPING CMP SLURRY 2 | AUTO-STOPPING CMP SLURRY 2 |
|---|---|---|---|---|---|---|---|---|
| Wafer # | 1 | 2 | 3 | 4 | 5 | 6 | 7 | 8 |
| Polish Time (sec) | 130 | 145 | 160 | 185 | 150 | 175 | 200 | 225 |
| Pre-CMP Up Oxide (Å) | 22233 | 22191 | 22192 | 21860 | 38576 | 38549 | 38540 | 38516 |
| Pre-CMP Down Oxide (Å) | 13078 | 13068 | 13045 | 13063 | 19528 | 19501 | 19487 | 19469 |
| Pre-CMP Step Height (Å) | 9155 | 9123 | 9147 | 8797 | 19048 | 19048 | 19053 | 19047 |
| Post-CMP Up Oxide (Å) | 15121 | 13138 | 11251 | 5078 | 25193 | 21194 | 18681 | 18415 |
| Post-CMP Down Oxide (Å) | 12947 | 12597 | 11383 | 5198 | 19525 | 19284 | 18446 | 18174 |
| Post-CMP Step Height (Å) | 2174 | 541 | 132 | 120 | 5668 | 1910 | 235 | 241 |
| Total Up Oxide Removal (Å) | 7112 | 9053 | 10941 | 16782 | 13383 | 17355 | 19859 | 20101 |
| Total Down Oxide Removal (Å) | 131 | 471 | 1662 | 7865 | 3 | 217 | 1041 | 1295 |
| Overall Planarization Efficiency (%) | 98 | 95 | 85 | 53 | 100 | 99 | 95 | 94 |
| Topography Polish Rate (Å/min) |  |  | 4103 |  |  |  | 5958 |  |
| Planar Surface Polish Rate (Å/min) |  |  |  | 14018 |  |  |  | 581 |
| Topography Selectivity |  |  |  | 0.29 |  |  |  | 10.3 |

Additional advantages and modifications will readily occur to those skilled in the art. Therefore, the invention in its broader aspects is not limited to the specific details and illustrative examples shown and described herein. Accordingly, various modifications may be made without departing from the spirit or scope of the general inventive concept as defined by the appended claims and their equivalents.

What is claimed:

1. A method for polishing a topographic layer consisting only of dielectric silicon dioxide having areas of up oxide and areas of down oxide, the method comprising:

providing, on both the areas of up oxide and the areas of down oxide, an aqueous slurry composition comprising from about 0.5% to about 10.0% by weight of ceria abrasive particles, and from about 0.006% to about 0.04% by weight of polyethyleneimine; and polishing the topographic dielectric silicon dioxide layer using a polishing pad with the aqueous slurry composition disposed therebetween to remove the areas of up oxide and thereby achieve a polished surface consisting only of dielectric silicon dioxide having a predetermined minimum step height of less than about 500 Å;

wherein:
   (i) the aqueous slurry composition exhibits auto-stopping behavior once the predetermined minimum step height is achieved;
   (ii) the aqueous slurry composition maintains a topography selectivity of at least about 5 or higher for a polishing period that includes over-polishing for twenty-five seconds after the predetermined minimum step height is achieved, where the topography selectivity is expressed as the ratio of the rate at which the areas of up oxide are removed to the rate at which the areas of down oxide are removed during polishing; and
   (iii) the aqueous slurry composition maintains an overall polishing efficiency percentage of greater than 90% for the polishing period that includes over-polishing for twenty-five seconds after the predetermined minimum step height is achieved, where the overall polishing efficiency percentage is expressed according to the equation: ((amount of up oxide removed−amount of down oxide removed)/amount of up oxide removed)×100.

2. The method according to claim 1 wherein the predetermined minimum step height is less than about 100 Å.

3. The method according to claim 1 wherein the ceria abrasive particles have a mean volume secondary particle diameter of from about 100 nm to about 175 nm.

4. The method according to claim 1 wherein the polishing step planarizes an inter-layer dielectric layer in an integrated circuit device.

5. The method according to claim 1 wherein the polishing step is a first polishing step in a two-step process of forming a shallow trench isolation structure in an integrated circuit device.

6. A method for polishing a topographic layer consisting only of dielectric silicon dioxide having areas of up oxide and areas of down oxide, the method comprising:
   providing, on both the areas of up oxide and the areas of down oxide, an aqueous slurry composition comprising from about 0.5% to about 10.0% by weight ceria abrasive particles having a mean volume secondary particle diameter of from about 100 nm to about 175 nm, and
   from about 0.006% to about 0.04% by weight of a polyethyleneimine having a weight average molecular weight of from about 10,000 to about 25,000; and
   polishing the topographic dielectric silicon dioxide layer using a polishing pad with the aqueous slurry composition disposed therebetween to remove the areas of up oxide and thereby achieve a polished surface consisting only of dielectric silicon dioxide having a predetermined minimum step height of less than about 500 Å;
wherein:
   (i) the aqueous slurry composition exhibits auto-stopping behavior once the predetermined minimum step height is achieved;
   (ii) the aqueous slurry composition maintains a topography selectivity of at least about 5 or higher for a polishing period that includes over-polishing for twenty-five seconds after the predetermined minimum step height is achieved, where the topography selectivity is expressed as the ratio of the rate at which up oxide is removed to the rate at which down oxide is removed during polishing; and
   (iii) the aqueous slury composition maintains an overall polishing efficiency percentage of greater than 90% for the polishing period that includes over-polishing for twenty-five seconds after the predetermined minimum step height is achieved, where the overall polishing efficiency percentage is expressed according to the equation: ((amount of up oxide removed−amount of down oxide removed)/amount of up oxide removed)×100.

7. The method according to claim 6 wherein the polishing step planarizes an inter-layer dielectric layer in an integrated circuit device.

8. The method according to claim 6 wherein the predetermined minimum step height is less than about 100 Å.

9. The method according to claim 6 wherein the polishing step is a first polishing step in a two-step process of forming a shallow trench isolation structure in an integrated circuit device.

\* \* \* \* \*